(12) United States Patent
Akahori et al.

(10) Patent No.: US 7,670,184 B2
(45) Date of Patent: Mar. 2, 2010

(54) ELECTRICAL JUNCTION BOX

(75) Inventors: Masahiro Akahori, Kakegawa (JP);
Takao Nogaki, Kakegawa (JP);
Toshinori Iwai, Kakegawa (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 11/984,142

(22) Filed: Nov. 14, 2007

(65) Prior Publication Data

US 2008/0110662 A1   May 15, 2008

(30) Foreign Application Priority Data

Nov. 15, 2006   (JP) .............................. 2006-308951

(51) Int. Cl.
*H01R 13/68* (2006.01)
(52) U.S. Cl. .................. 439/620.27; 439/76.2; 439/949
(58) Field of Classification Search ............ 439/620.27, 439/76.2, 949, 620.34; 361/837, 775
See application file for complete search history.

(56) References Cited

U.S. PATENT DOCUMENTS

| | | | | |
|---|---|---|---|---|
| 5,088,940 A * | 2/1992 | Saito | ..................... | 439/620.34 |
| 5,438,310 A | 8/1995 | Ikari | | |
| 6,333,846 B1 * | 12/2001 | Hashizawa et al. | .......... | 361/649 |
| 6,456,188 B1 * | 9/2002 | Tsuchiya | ..................... | 337/235 |
| 7,347,733 B2 * | 3/2008 | Murakami | ............. | 439/620.27 |
| 7,357,649 B2 * | 4/2008 | Asao | ......................... | 439/76.2 |

FOREIGN PATENT DOCUMENTS

| | | |
|---|---|---|
| EP | 1 107 276 A2 | 6/2001 |
| JP | 8-182156 | 7/1996 |
| JP | 10-241547 | 9/1998 |
| JP | 10-247450 | 9/1998 |
| JP | 2000-332446 | 11/2000 |
| JP | 2001-155618 | 6/2001 |

OTHER PUBLICATIONS

German Office Action issued Jan. 19, 2009 in corresponding German Patent Application No. 10 2007 048 888.4-34.

* cited by examiner

*Primary Examiner*—Hien Vu
(74) *Attorney, Agent, or Firm*—Edwards Angell Palmer & Dodge LLP

(57) ABSTRACT

An electrical junction box including a box main body and a wiring block. The box main body includes a cassette block. The wiring block includes a first bus bar, a second bus bar, and a fuse. Each bus bar includes an electric parts connecting part and the power source connecting part. The electric parts connecting part is connected to electric parts attached to the cassette block. The power source connecting part includes a fuse connecting piece and a connecting piece. A terminal fitting connected to a power source is connected to the connecting piece. The fuse connects the fuse connecting pieces of the bus bars.

3 Claims, 7 Drawing Sheets

ELECTRICAL JUNCTION BOX

CROSS REFERENCE TO RELATED APPLICATIONS

This application is on the basis of Japanese Patent Application No. 2006-308951, the contents of which are hereby incorporated by reference.

BACKGROUND OF THE INVENTION

1. Field of the Invention

The present invention relates to an electrical junction box mounted on a vehicle or the like.

2. Description of the Related Art

Various electronic components such as a head lamp, a tail lamp, a starter motor and the like are generally mounted on a vehicle.

For supplying electricity to the various electronic components, junction block is disposed on a proper position of the vehicle. The junction block integrally includes many electric parts such as fuses and relays.

Incidentally, because the junction block may include a fuse, a relay, and a bus bar, the junction block is also referred to as a fuse block, a relay box, or an electrical junction box (for example, see Patent Document 1 and 2). Hereafter in this specification, the junction box is referred to as the electrical junction box.

The electrical junction box described in the Patent Document 1 and 2 includes a box main body, and a wiring block. The box main body is made of insulating synthetic resin, and formed in a box shape. A mounting part on which the electric parts such as a relay or a fuse are mounted, and a connecting part to which a connector of a wiring harness is connected are disposed on the box main body.

The box main body receives the wiring block. The wiring block includes a first bus bar to be connected to a battery as a first power source, a second bus bar to be connected to a generator as a second power source, a fuse to connect the first and second bus bars, and a connecting terminal.

The first and second bus bars are made of conductive plate metal. Each of the first and second bus bars includes a power source connecting part to be connected to the battery or the generator, and a terminal part to be positioned in the mounting part when the box main body receives the wiring block and to be connected to the electric parts such as the relay or the fuse.

The fuse connects the first and second bus bars at positions away from the power source connecting parts. A part of the connecting terminal is positioned in the mounting part and connected to the electric parts such as the relay or the fuse. The other part of the connecting terminal is positioned in the connecting part and connected to the connector of the wiring harness.

In the electrical junction box, the wiring block electrically connects the power sources, the electric parts, and electric wires of the wiring harness according to a predetermined pattern. Then, the electrical junction box supplies electricity to the electronic components connected to the wiring harness.

[Patent Document 1] Japanese Published Patent Application No. H10-241547

[Patent Document 2] Japanese Published Patent Application No. 2001-155618

Because the fuse connects the bus bars at positions away from the power source connecting parts in the electrical junction box, a large electric current flows through an almost full length of each bus bar. Therefore, for preventing the bus bars from heating, a width of each bus bar should be large through the full length thereof in a conventional electrical junction box. When the bus bar becomes wide through the full length thereof, the bus bar, namely, the wiring block becomes large, and the electrical junction box becomes large.

Accordingly, an object of the present invention is to provide an electrical junction box that can be small-sized.

SUMMERY OF THE INVENTION

In order to attain the object, according to the present invention, there is provided an electrical junction box including:

a first bus bar having a first connection to be connected to a first power source;

a second bus bar having a second connection to be connected to a second power source;

a fuse connecting the first and the second bus bars;

first and second fuse connections respectively disposed close to the first and second connections and respectively connecting the fuse to the first and second bus bars.

Preferably, the first and second connections are respectively connected to the first and second power sources when bolts respectively penetrate the first and second connections. Further, the first and second fuse connections are respectively overlapped with the first and second connections in a longitudinal direction of the bolts.

Preferably, the electrical junction box further includes a box main body receiving the first and second bus bars. Further, the box main body includes a fuse receiving chamber for receiving the fuse connected to the fuse connection, and an inspection hole penetrating an outer wall of the fuse receiving chamber for allowing the fuse to be seen from an outside of the box main body.

Preferably, the inspection hole is an oblong hole extended straight in the longitudinal direction of the bolt.

These and other objects, features, and advantages of the present invention will become more apparent upon reading of the following detailed description along with the accompanied drawings.

BRIEF DESCRIPTION OF THE DRAWINGS

FIG. 4 is a perspective view showing a cassette block of the electrical junction box shown in FIG. 2, terminal fittings, and the like;

FIG. 5 is a perspective view showing the cassette block of the electrical junction box shown in FIG. 2, a wiring block, and the like;

DETAILED DESCRIPTION OF EXEMPLARY EMBODIMENTS

An electrical junction box 1 according to an embodiment of the present invention will be explained with reference to FIGS. 1 to 7. The electrical junction box 1 shown in FIG. 1 is mounted on a vehicle.

Figure 1:
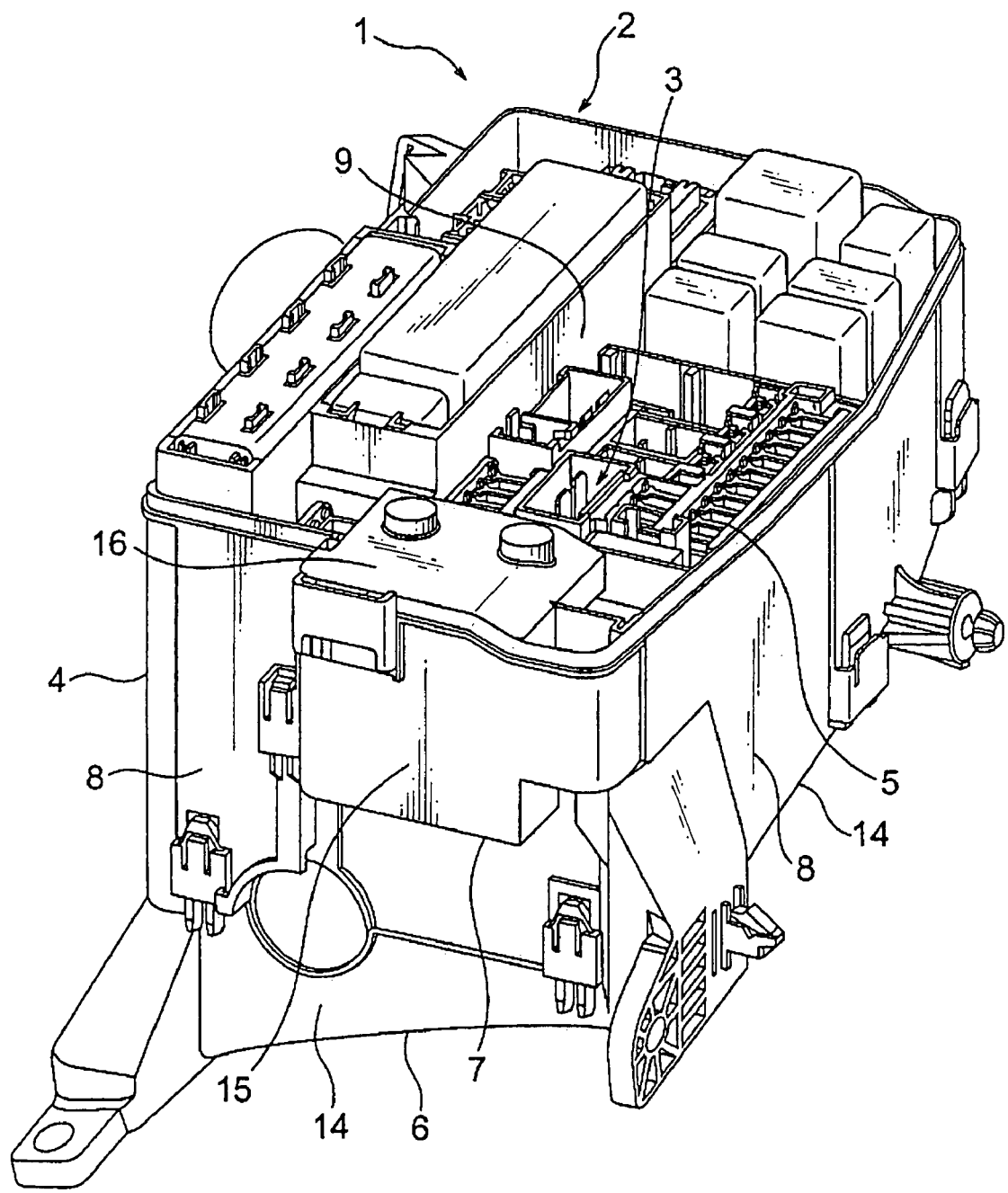
FIG. 1 is a perspective view showing an electrical junction box according to a first embodiment of the present invention.

As shown in FIG. 1, the electrical junction box 1 includes a box main body 2 and a wiring block 3.

Figure 2:
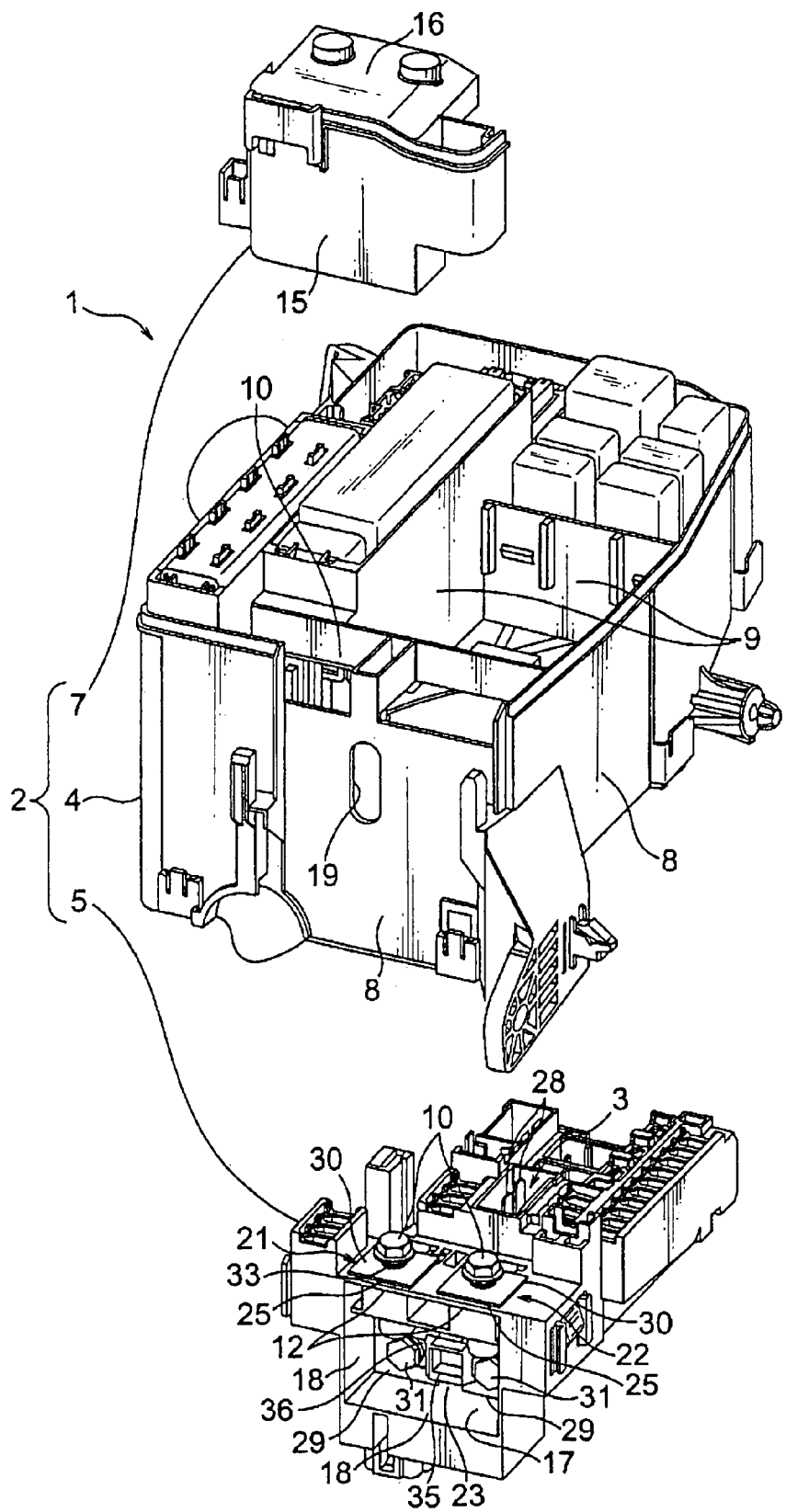
FIG. 2 is an exploded perspective view of the electrical junction box shown in FIG. 1.

As shown in FIG. 1, the box main body 2 includes a main body 4, a cassette block 5, a not-shown upper cover, a lower cover 6, and a side cover 7. The main body 4 is made of insulating synthetic resin, and molded by a well-known injection molding machine. As shown in FIG. 2, the main body 4 is formed in a tubular shape with a plurality of outer walls 8 standing in a row. Further, partition walls 9 partitioning the main body 4 are mounted on the main body 4.

A mounting part on which relays and fuses are mounted is formed at an upper side of the main body 4. A connector connecting part to which a not-shown connector of a wiring harness is connected is formed at a lower side of the main body 4.

The wiring harness includes a plurality of electric wires and a connector attached to ends of the electric wires. The connector is connected to the connector connecting part or various electronic components mounted on a vehicle. The main body 4 receives bus bars electrically connecting the electric parts mounted on the mounting part to terminals of the connector connected to the connector connecting part.

Figure 4:
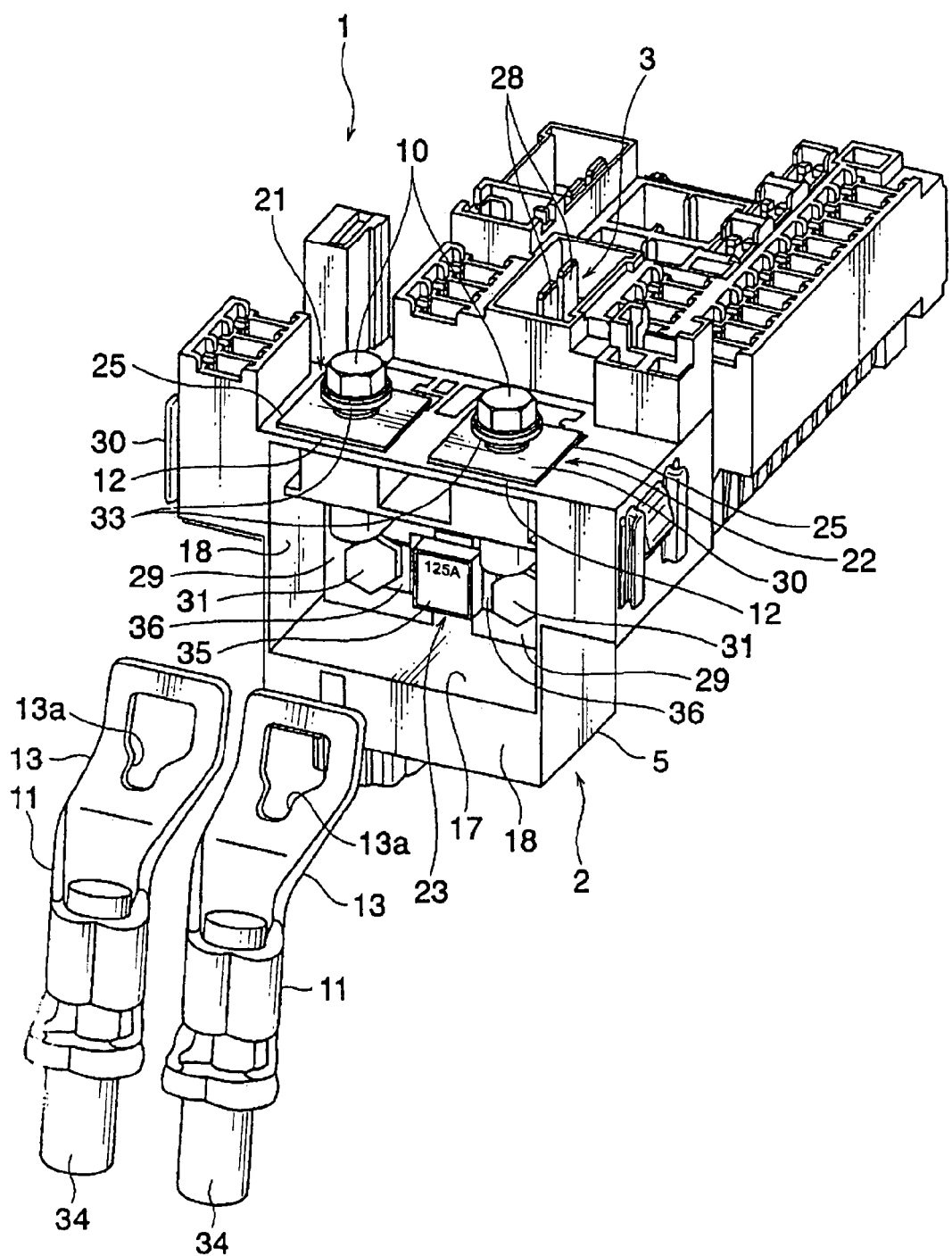
Figure 5:
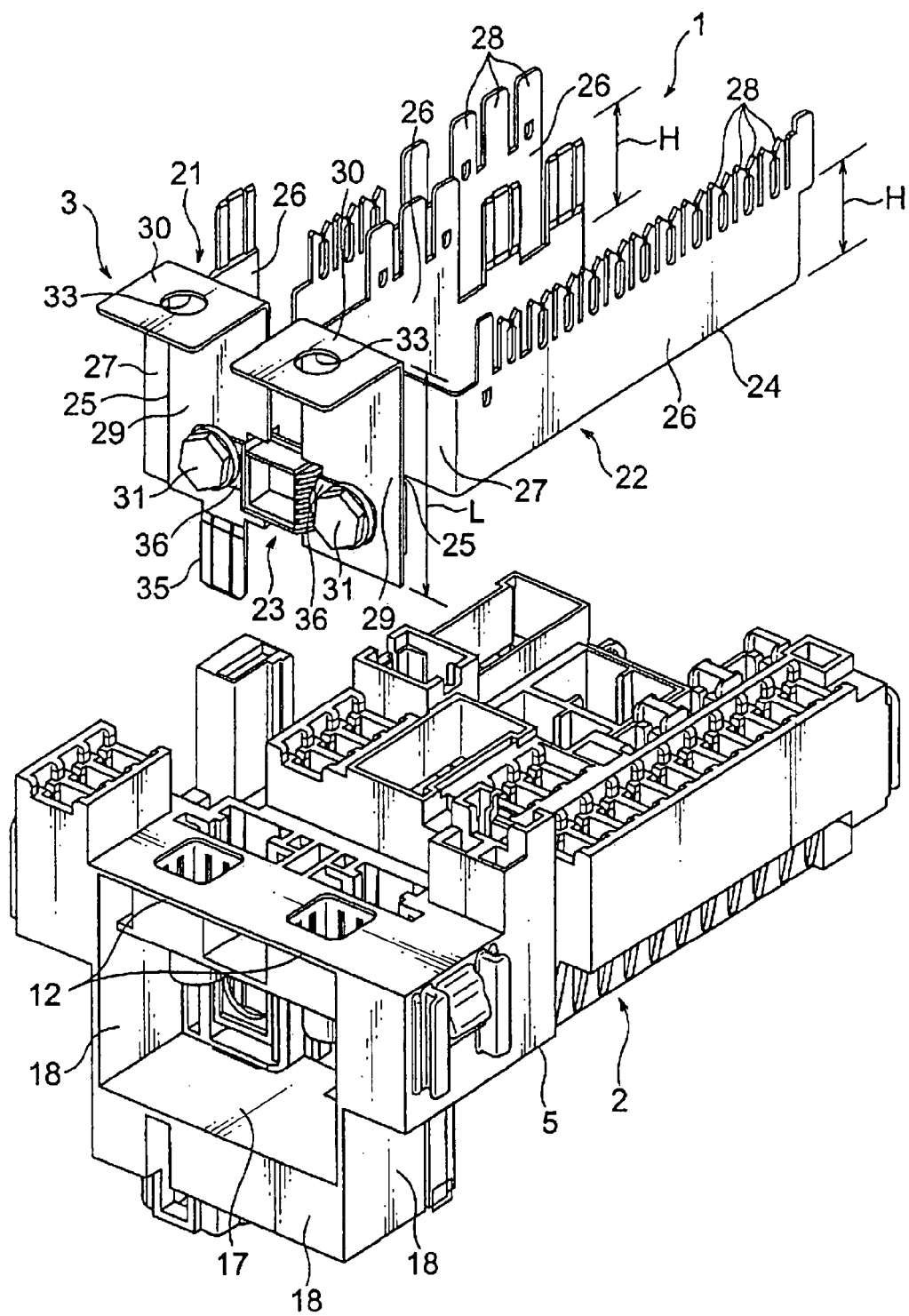

The cassette block 5 is made of insulating synthetic resin, and as shown in FIGS. 4 and 5, formed in a box shape. The cassette block 5 is received in the main body 4 via a lower opening thereof shown in FIG. 2. Slit-shaped bus bar receiving grooves for receiving later-described bus bars 21, 22 of the wiring block 3 are formed on the cassette block 5.

The mounting part on which relays and fuses are mounted is formed at an upper side of the cassette block 5. The connector connecting part to which the not-shown connector of the wiring harness is connected is formed at a lower side of the cassette block 5.

Further, two terminal attaching parts 12 are formed at the upper side of the cassette block 5. The terminal attaching parts 12 are disposed at edges of the bus bar receiving grooves. Surfaces of the terminal attaching parts 12 are flat. Not-shown nuts are buried under the terminal attaching parts 12.

Later-described connecting pieces 30 of the bus bars 21, 22, and electric contact parts 13 of terminal fittings 11 (shown in FIG. 4) are sequentially overlapped on surfaces of the terminal attaching parts 12. Then, bolts 10 are screwed into the nuts via through holes 33 formed on the connecting pieces 30 and holes 13a of the electric contact parts 13. Thus, the electric contact parts 13 of the terminal fittings 11 are caught between the connecting pieces 30 and the bolts 10. Thus, the terminal fittings 11 are attached to the terminal attaching parts 12.

The upper cover is made of insulating synthetic resin, and molded by the well-known injection molding machine. The upper cover is formed in a tube shape having a top wall with a plurality of outer walls. The upper cover is attached to the main body 4 in a manner that the upper cover covers the top side of the main body 4.

Figure 3:
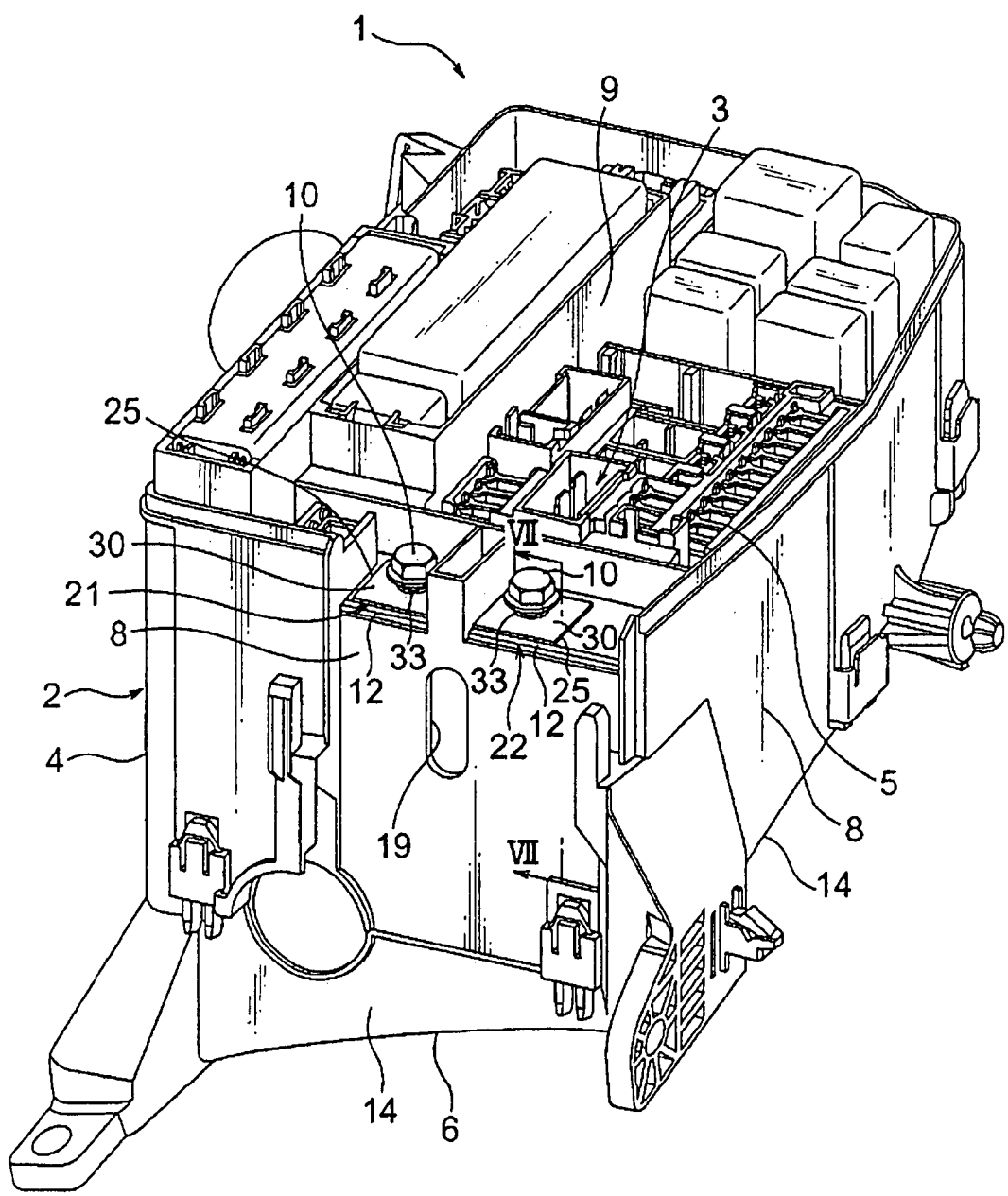
FIG. 3 is a perspective view showing the electrical junction box shown in FIG. 1 of which a side cover is removed from a main body thereof.

The lower cover 6 is made of insulating synthetic resin, and molded by the well-known injection molding machine. As shown in FIGS. 1 and 3, the lower cover 6 is formed in a tube shape having a bottom wall with a plurality of outer walls 14. The lower cover 6 is attached to the main body 4 in a manner that the lower cover 6 covers the bottom side of the main body 4.

The side cover 7 is made of insulating synthetic resin, and molded by the well-known injection molding machine. The side cover 7 is attached to the main body 4 and covers the terminal attaching parts 12 of the cassette block 5 attached to the main body 4. As shown in FIGS. 1 and 2, the side cover 7 integrally includes a sidewall 15 and a top wall 16.

A gap is formed between the outer wall 8 of the main body 4 and the sidewall 15 attached to the main body 4. A gap is formed between the top side of the main body 4 and the top wall 16 attached to the main body 4.

The top wall 16 is continued to the sidewall 15. When the side cover 7 is attached to the main body 4, the side cover 7 covers the terminal attaching parts 12 and the terminal fittings 11 attached to the terminal attaching parts 12.

Figure 7:
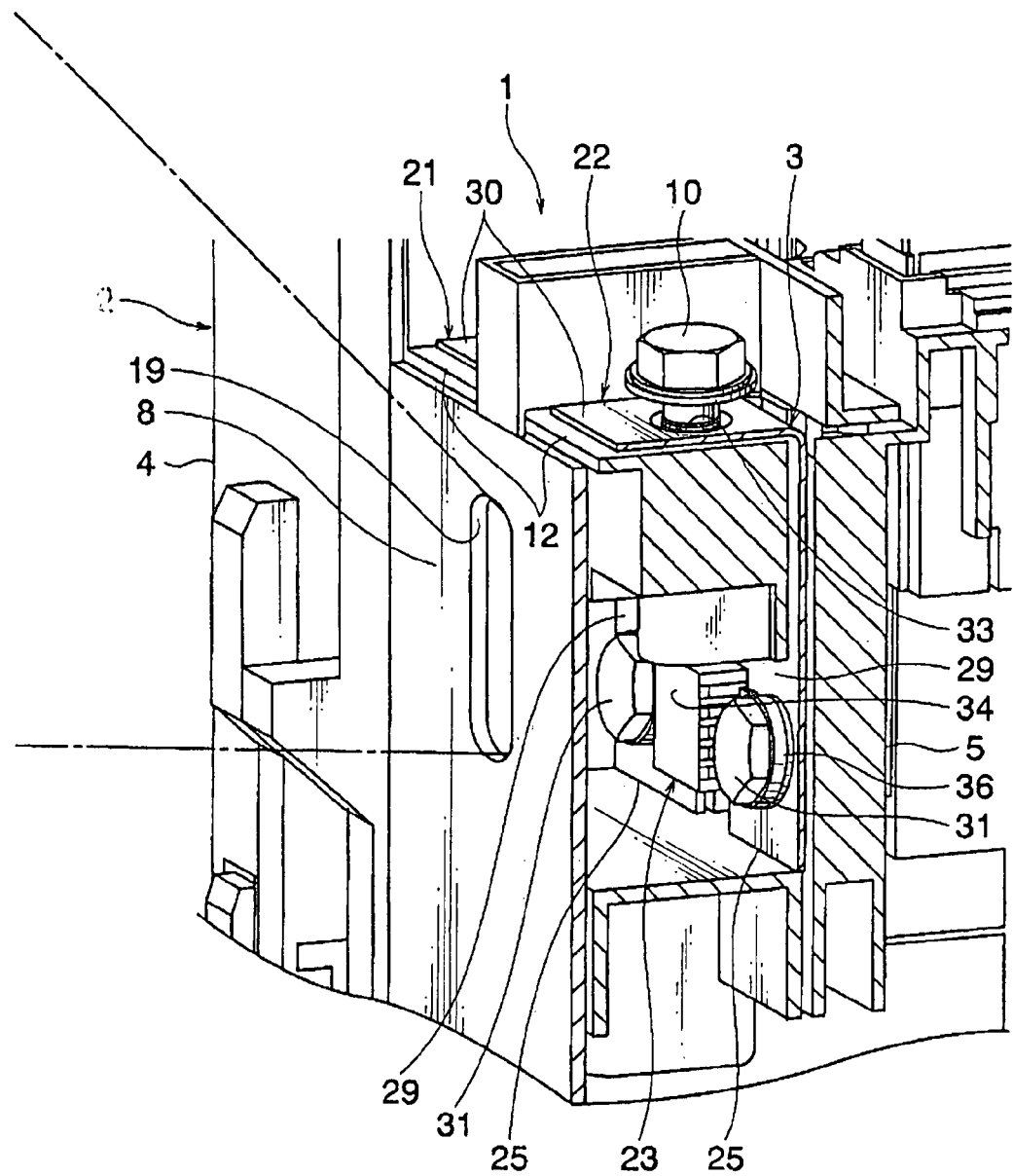
FIG. 7 is a partially sectional perspective view taken on line VII-VII in FIG. 3.

Further, a fuse receiving chamber 17 shown in FIG. 5 is formed on the box main body 2. The fuse receiving chamber 17 receives a later-described fuse 23 of the wiring block 3 attached to the cassette block 5. The fuse receiving chamber 17 is surrounded by a plurality of walls (shown in FIGS. 4 and 5) near the terminal attaching parts 12 of the cassette block 5, and the outer walls 8 of the main body 4. An inspection hole 19 shown in FIGS. 2 and 7 is penetrated through the outer wall 8 of the main body 4 composing the fuse receiving chamber 17.

The inspection hole 19 is an oblong hole extended straight in a longitudinal direction of the bolt 10. The inspection hole 19 allows the fuse 23 to be seen from an outside of the main body 4, namely, the box main body 2. Further, as shown by an alternate long and short dash line in FIG. 7, the inspection hole 19 allows the fuse 23 to be seen from an upper outside of the main body 4. The sidewall 15 of the side cover 7 attached to the main body 4 covers the inspection hole 19. The relays and the fuses as the electric parts are mounted on the main body 4 and the cassette block 5 attached to the main body 4. The connector of the wiring harness is connected to the box main body 2. The terminal fittings 11 are attached to the terminal attaching parts 12. The upper and lower covers are attached to the main body 4. Thus, the box main body 2 receives the relays, the fuses as the electric parts, and the terminal fittings 11.

Figure 6:
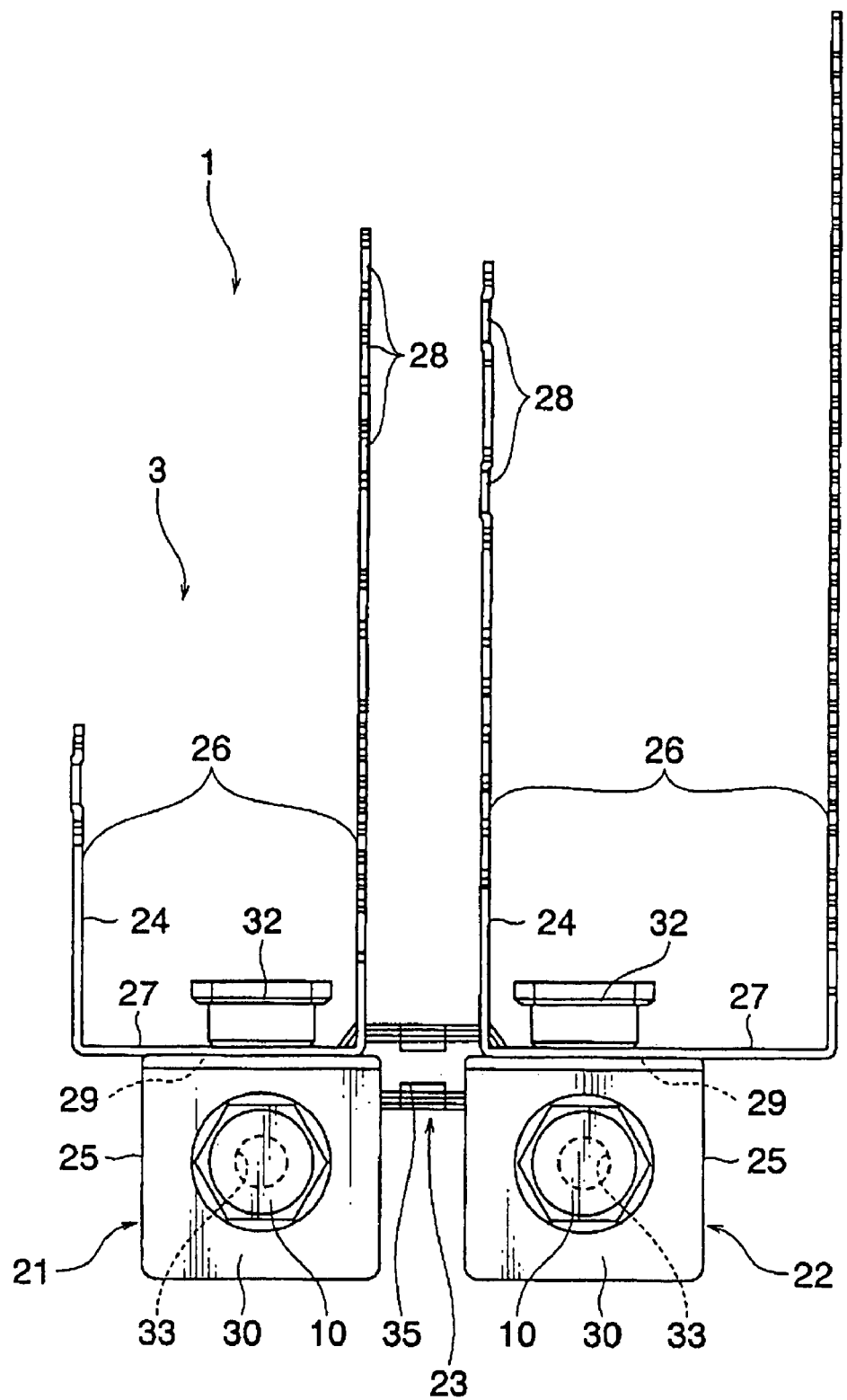
FIG. 6 is a plan view showing the wiring block shown in FIG. 5.

As shown in FIGS. 5 and 6, the wiring block 3 includes the first bus bar 21, the second bus bar 22, the fuse 23, and a not-shown connecting terminal.

The first and second bus bars 21, 22 are made of conductive plate metal. As shown in FIGS. 5 and 6, each of the bus bars 21, 22 includes an electric parts connecting part 24 and a power source connecting part 25. The electric parts connecting part 24 includes a pair of parallel parts 26 parallel to each other, and a connecting part 27 connecting both ends of the parallel parts 26, and is formed in a U-shape in a plan view. The parallel parts 26 are disposed in the mounting part of the cassette block 5, and have a plurality of terminals 28 to be connected to the relays and fuses. A width H of the electric parts connecting part 24 is constant throughout a full length thereof.

The power source connecting part 25 integrally includes a fuse connecting piece 29 as a fuse connecting part, and a connecting piece 30 as a connecting part. The fuse connecting piece 29 is formed in a band plate shape, and overlappingly attached to the connecting part 27 of the electric parts connecting part 24. A nut 32 into which a fuse fixing bolt 31 is screwed is integrally formed on the fuse connecting piece 29.

Each connecting piece 30 is integrally formed in one piece with the fuse connecting piece 29 as shown in FIG. 5. The fuse connecting piece 29 is bent at a 90° angle to the connecting piece 30. Namely, the fuse connecting piece 29 is disposed in the vicinity of the connecting pieces 30. A through hole 33 for inserting the bolt 10 is formed on the connecting pieces 30.

A length L of the power source connecting part 25 (also referred to as a length of the fuse connecting piece 29) is larger than the width H of the electric parts connecting part 24. The terminal fitting 11 connected to a generator as a first power source via an electric wire 34 is attached to the connecting piece 30 of the power source connecting part 25 of the first bus bar 21. The terminal fitting 11 connected to a battery as a second power source via the electric wire 34 is attached to the connecting piece 30 of the power source connecting part 25 of the second bus bar 22.

The fuse 23 includes a main part 35 having a fuse element, and a pair of terminals 36 extended away from each other. A hole for inserting the fuse fixing bolt 31 is formed on each terminal 36. The pair of terminals 36 is, of course, connected to the fuse element.

One terminal 36 of the fuse 23 is overlapped with the fuse connecting piece 29 of the power source connecting part 25 of the first bus bar 21, and the other terminal 36 is overlapped with the fuse connecting piece 29 of the power source connecting part 25 of the second bus bar 22. Then, the bolt 31 is screwed into the nut 32 via the hole. Thus, the fuse 23 connects the first and second bus bars 21, 22. When an electrical current over a predetermined current value flows through the bus bars 21, 22, the fuse element is melted to interrupt the electrical current between the bus bars 21, 22.

A part of the connecting terminals are disposed in the mounting part of the cassette block 5 to be connected to the relays and the fuses, and the other part of the connecting terminals are disposed in the connecting part of the cassette block 5 to be connected to the terminals of the wiring harness.

The electric parts connecting parts 24 of the bus bars 21, 22 are mainly received in the bus bar receiving grooves. The fuse connecting pieces 29 of the power source connecting parts 25 and the fuse 23 are received in the fuse receiving chamber 17. The connecting pieces 30 of the power source connecting parts 25 are overlapped with the terminal attaching parts 12. Thus, the wiring block 3 is attached to the cassette block 5. Namely, the first and second bus bars 21, 22 are received in the cassette block 5 of the box main body 2. When the terminal fittings 11 are attached to the terminal attaching parts 12, the wiring block 3 is connected to the generator and the battery via the terminal fittings 11 and the electric wires 34.

Further, when the cassette block 5 is attached to the main body 4, electric parts are mounted on the mounting part, and the terminals of the wiring harness are connected to the connecting part, the wiring block 3 electrically connects the power source, the electric parts, and the various electronic components connected to the wiring harness according to a predetermined pattern. Then, the wiring block 3 supplies the electric power from the power source to the various electronic components via the electric parts.

According to this embodiment, because the fuse 23 is connected near the connecting pieces 30, a large electric current is prevented from flowing through an almost full length of each bus bar 21, 22. Namely, an electric powers flowing away from the connecting pieces 30 of the bus bars 21, 22 can be reduced. Therefore, a width H of each bus bar 21, 22 is not needed to be large through the full length thereof. In particular, the width H away from the connecting pieces 30 can be reduced. Therefore, the bus bars 21, 22 can be small-sized, and resultingly, the electrical junction box 1 can be small-sized.

Because the fuse connecting piece 29 is overlapped with the connecting pieces 30 in the longitudinal direction of the bolt 10, a space around the connecting pieces 30 can be used effectively. Therefore, the electrical junction box 1 can be further small-sized.

Because the inspection hole 19 is formed on the outer wall 8 of the fuse receiving chamber 17, the fuse 23 in the fuse receiving chamber 17 can be seen, and whether the fuse 23 is melted or not is easily known.

Because the inspection hole 19 is oblong, the fuse 23 in the fuse receiving chamber 17 can be seen from an oblique direction in the longitudinal direction of the bolt 10. Thus, the fuse 23 can be seen from a wire range, and whether the fuse 23 is melted or not is further easily known.

In the embodiment described above, the connecting pieces 30 and the fuse connecting piece 29 are overlapped with each other in the longitudinal direction of the bolt 10. However, according to the present invention, the connecting pieces 30 and the fuse connecting piece 29 may not be overlapped with each other. Namely, according to the present invention, the fuse connecting piece 29 is at least disposed in the vicinity of the connecting pieces 30.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. An electrical junction box comprising:
a first bus bar having first terminals extending along thereon and a first power source connection piece to be connected to a first electric power source contact;
a second bus bar having second terminals extending along thereon and a second power source connection piece to be connected to a second electric power source contact;
the first and second bus bars each connected to a side end of a connecting plate;
a fuse connected to the connecting plate for electrically connecting the first and the second bus bars;
first and second fuse connection pieces respectively disposed close to the first and second power source connection pieces and respectively connecting the fuse to the first and second bus bars,
wherein the first and second power source connection pieces are respectively connected to the first and second electric power source contacts when bolts respectively penetrate the first and second power source connection pieces, and
wherein each of the first and second fuse connection pieces is respectively formed integrally in one piece with a corresponding power source connection piece such that at least one of the first and second power source connection pieces is bent outwardly at a 90°angle to a corresponding fuse connection piece.

2. The electrical junction box as claimed in claim 1 further comprising a box main body receiving the first and second bus bars,
wherein the box main body includes a fuse receiving chamber for receiving the fuse connected to the fuse connection, and an inspection hole penetrating an outer wall of the fuse receiving chamber for allowing the fuse to be seen from an outside of the box main body.

3. The electrical junction box as claimed in claim 2, wherein the inspection hole is an oblong hole extended straight in the longitudinal direction of the bolt.

* * * * *